United States Patent
Jiang (10) Patent No.: US 10,756,295 B2
(45) Date of Patent: Aug. 25, 2020

(54) TERMINAL CASE AND TERMINAL INCLUDING THE SAME

(71) Applicant: Beijing Xiaomi Mobile Software Co., Ltd., Beijing (CN)

(72) Inventor: Juanjuan Jiang, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 0 days.

(21) Appl. No.: 16/375,677

(22) Filed: Apr. 4, 2019

(65) Prior Publication Data

US 2020/0075885 A1    Mar. 5, 2020

(30) Foreign Application Priority Data

Sep. 4, 2018 (CN) .......................... 2018 1 1028218

(51) Int. Cl.
*H04B 1/3888* (2015.01)
*H01L 51/52* (2006.01)
*H04M 1/02* (2006.01)

(52) U.S. Cl.
CPC ....... *H01L 51/5237* (2013.01); *H04B 1/3888* (2013.01); *H04M 1/0268* (2013.01); *H01L 2251/5338* (2013.01)

(58) Field of Classification Search
CPC .. H01L 51/5237; H04B 1/3888; C03B 23/245
See application file for complete search history.

(56) References Cited

U.S. PATENT DOCUMENTS

| 5,168,281 | A  | * | 12/1992 | Tokunaga | H01Q 1/273 343/718 |
|---|---|---|---|---|---|
| 2013/0002133 | A1 | | 1/2013 | Jin et al. | |
| 2013/0188366 | A1 | * | 7/2013 | Russell-Clarke | C03B 23/245 362/362 |
| 2014/0002385 | A1 | | 1/2014 | Ka et al. | |
| 2016/0112086 | A1 | * | 4/2016 | Lei | H04B 1/3888 455/566 |
| 2017/0022092 | A1 | * | 1/2017 | DeMartino | C03C 3/097 |
| 2017/0206835 | A1 | | 7/2017 | Hirakata et al. | |
| 2017/0357113 | A1 | | 12/2017 | Yamazaki et al. | |

OTHER PUBLICATIONS

Extended European Search Report issued to EP Application No. 19191891.1 dated Jan. 17, 2020, (14p).

* cited by examiner

*Primary Examiner* — Myron Wyche
(74) *Attorney, Agent, or Firm* — Arch & Lake LLP (57) ABSTRACT

A terminal includes a front glass cover, a flexible-bendable display screen and a back cover. The front glass cover is formed of glass molding in a unibody, and includes: a front surface area covering a front surface of the terminal; and a first curved surface area, a second curved surface area, a third curved surface area and a fourth curved surface area respectively adjacent to the front surface area and respectively covering four sides of the terminal. The back cover is respectively connected to the first curved surface area, the second curved surface area, the third curved surface area and the fourth curved surface area. The flexible-bendable display screen is attached to an inner surface of the front glass cover, bent to each side surface of the terminal, bent for a second time at overlapping areas of sides of the terminal and covers the four sides and the overlapping areas.

11 Claims, 7 Drawing Sheets

TERMINAL CASE AND TERMINAL INCLUDING THE SAME

CROSS REFERENCE TO RELATED APPLICATION

The present application is based on and claims priority to Chinese patent application No. 201811028218.2, filed on Sep. 4, 2018, the entire disclosure of which is hereby incorporated by reference.

TECHNICAL FIELD

The present disclosure relates to the technical field of smart devices, and more particularly to a terminal.

BACKGROUND

In recent years, the rapid development of portable electronic devices, especially the smart phone market, has made smart phones an indispensable electronic device in daily life of users. Users hope that smart phones can realize more and more functions and can enable increasingly diversified interaction between smart phones and users. The screen as an important interactive medium has become one of the evaluation indicators of mobile phones. With the development of smart phones, it has become a development trend of mobile phones that the screen is getting bigger and bigger. However, the screen being getting bigger does not mean that the user experience is getting better. After all, for a mobile terminal, portability and easy-operability are also important. Therefore, subject to the limited size of the mobile phone, an effective display area of the screen becomes a mainstream trend of the smart phone. For a smart phone with a full screen, the screen ratio is an important design parameter. The screen ratio refers to a ratio of the screen area to the front cover area of the mobile phone, which is one of the important parameters for the smart phone to easily obtain the user's visual favor by the appearance.

In the related art, in order to prevent light leakage and achieve convenient wiring, black borders are provided on both sides of the screen of the smart phone. However, such black borders do not belong to the effective display area of the screen, which may limit the improvement of the screen ratio of the smart phone. How to eliminate the black borders has become an urgent problem to be solved in the field of smart phone designs.

SUMMARY

In order to overcome the problem existing in the related art, an embodiment of the present disclosure provides a terminal. The technical solution is as follows.

According to a first aspect of the present disclosure, there is provided a terminal including a front glass cover, a flexible-bendable display screen and a back cover. The front glass cover is formed of glass molding in a unibody. The front glass includes: a front surface area covering a front surface of the terminal; and a first curved surface area, a second curved surface area, a third curved surface area and a fourth curved surface area respectively adjacent to the front surface area, the first curved surface area, the second curved surface area, the third curved surface area and the fourth curved surface area respectively covering four sides of the terminal. The back cover is respectively connected to the first curved surface area, the second curved surface area, the third curved surface area and the fourth curved surface area. The flexible-bendable display screen is attached to an inner surface of the front glass cover, bent to each side surface of the terminal, bent for a second time at overlapping areas of sides of the terminal and covers the four sides of the terminal and the overlapping areas.

It should be understood that both the foregoing general description and the following detailed description are exemplary and explanatory only and are not restrictive of the disclosure.

BRIEF DESCRIPTION OF THE DRAWINGS

The accompanying drawings, which are incorporated in and constitute a part of this specification, illustrate embodiments consistent with the disclosure and, together with the description, serve to explain the principles of the disclosure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of apparatuses and methods consistent with aspects related to the disclosure as recited in the appended claims.

For a smart phone with a full screen, the screen ratio is an important design parameter. The screen ratio refers to a ratio of the screen area to the front cover area of the mobile phone. It is one of the important parameters for the smart phone to easily obtain the user's visual favor by the appearance.

In the related art, in order to prevent light leakage and achieve convenient wiring, black borders are provided on both sides of the screen of the smart phone. However, such black borders do not belong to the effective display area of the screen, which may limit the improvement of the screen ratio of the smart phone and affect user experience.

In order to solve the above problems, an embodiment of the present disclosure provides a terminal, including: a front glass cover, a flexible-bendable display screen and a back cover. The front glass cover is formed of glass molding in a unibody, and includes a front surface area covering the front surface of the terminal; and a first curved surface area, a second curved surface area, a third curved surface area, and a fourth curved surface area respectively adjacent to the front surface area; the first curved surface area, the second curved surface area, the third curved surface area, and the fourth curved surface area respectively covering four sides of the terminal. The back cover is respectively connected to the first curved surface area, the second curved surface area, the third curved surface area and the fourth curved surface area. The flexible-bendable display screen is attached to an inner surface of the front glass cover, bent to each side surface of the terminal, bent for a second time at overlapping areas of sides of the terminal and covers the four sides of the terminal and the overlapping areas.

In the terminal provided in the embodiment of the present disclosure, a front glass cover formed of glass molding in a unibody covers the front surface and the four sides of the terminal, and a flexible-bendable display screen is bent and covers the sides of the terminal. Thus, the front surface and the sides of the terminal are covered by the same screen. The black borders of the screen are all bent to the side surfaces, which can increase the effective display area and the screen ratio on the front surface of the screen and can eliminate the need to provide a metal middle frame for the sides of the terminal. This can simplify the terminal structure and make the terminal appearance simpler and more beautiful, improving the user experience.

It should be noted that the terminal may include an electronic device such as a smart phone, a television, a tablet, or a wearable device.

Figure 1:
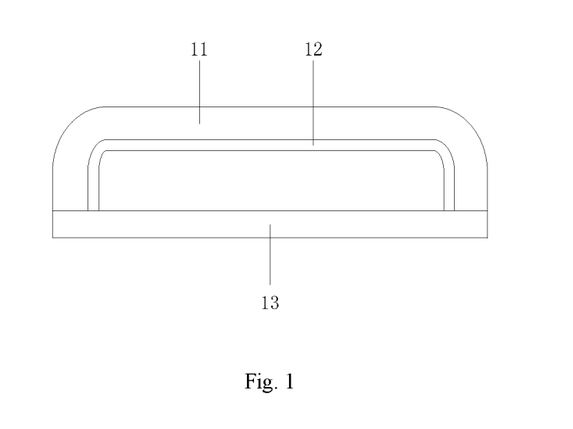
FIG. 1 is a cross sectional view of a terminal according to an example.
Figure 2:
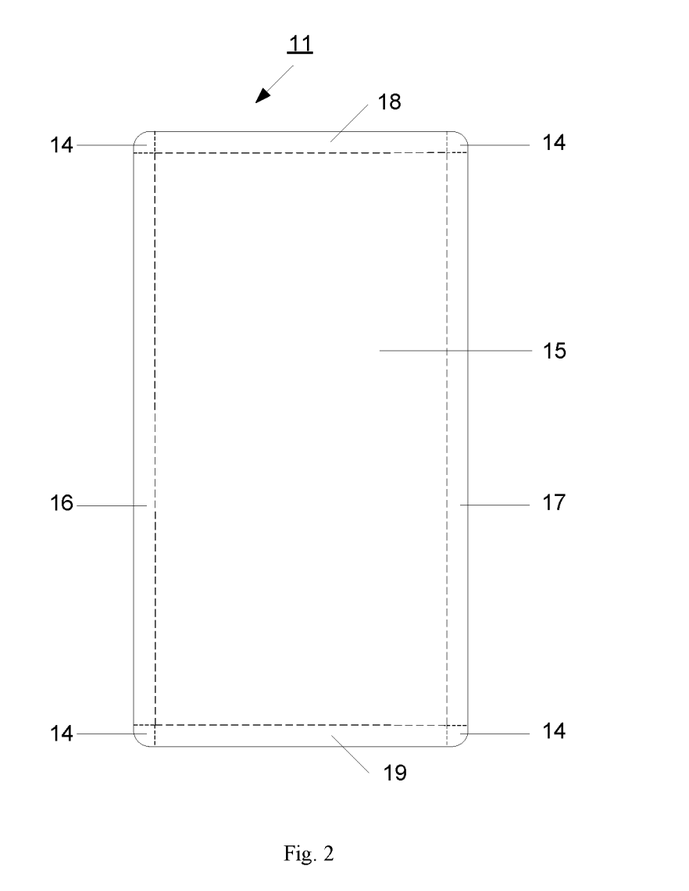
FIG. 2 is a front view of a terminal according to an example.
Figure 3:
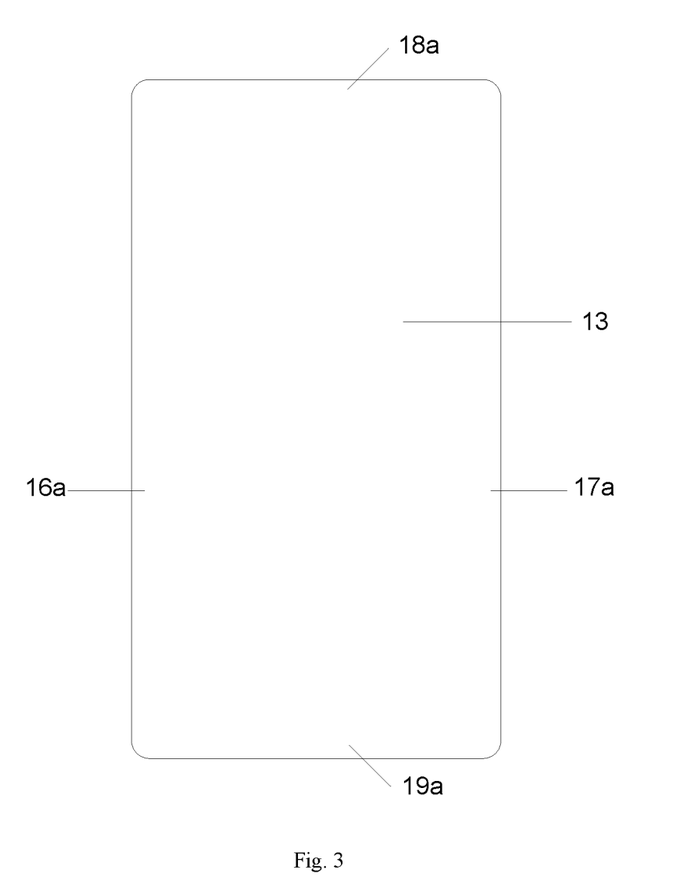
FIG. 3 is a rear view of a terminal according to an example.
Figure 4:
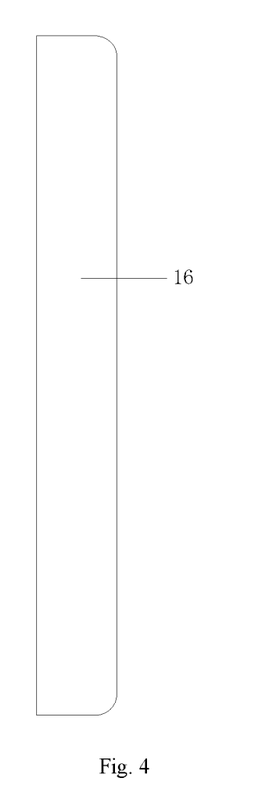
FIG. 4 is a left view of a terminal according to an example.
Figure 5:
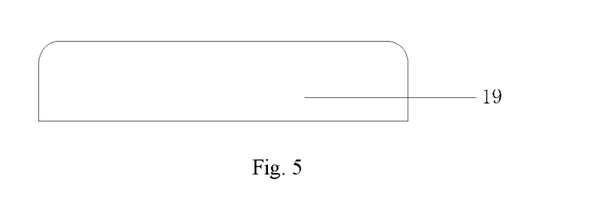
FIG. 5 is a bottom view of a terminal according to an example.

FIG. 1 is a cross sectional view of a terminal according to an example. FIG. 2 is a front view of a terminal according to an example. FIG. 3 is a rear view of a terminal according to an example. FIG. 4 is a left view of a terminal according to an example. FIG. 5 is a bottom view of a terminal according to an example. As shown in FIGS. 1 to 5, the terminal includes: a front glass cover 11, a flexible-bendable display screen 12, and a back cover 13.

The front glass cover 11 is formed of glass molding in a unibody, and includes a front surface area 15 covering the front surface of the terminal. The front glass cover 11 further includes a first curved surface area 16, a second curved surface area 17, a third curved surface area 18, and a fourth curved surface area 19 respectively adjacent to the front surface area 15. In other words, each of the first curved surface area 16, the second curved surface area 17, the third curved surface area 18, and the fourth curved surface area 19 is adjacent to the front surface area 15, where the first curved surface area 16, the second curved surface area 17, the third curved surface area 18, and the fourth curved surface area 19 respectively covers four sides of the terminal.

In FIG. 3, the back cover 13 includes four edge regions 16a, 17a, 18a, and 19a, each of which is respectively connected to the first curved surface area 16, the second curved surface area 17, the third curved surface area 18 and the fourth curved surface area 19. The flexible-bendable display screen 12 is attached to an inner surface of the front glass cover 11, bent to each side surface of the terminal, bent for a second time at overlapping areas 14 of sides of the terminal and covers the four sides and the overlapping areas 14 of the terminal.

Since the front glass cover is formed of glass molding in a unibody, the front glass cover can cover the four sides of the terminal, so that the flexible-bendable display screen can extend and cover the four sides of the terminal and the overlapping areas of the respective sides, which can make the flexible-bendable display screen present content display and interaction features on the entire area including the overlapping areas of the sides of the terminal. This is convenient for the user operation.

For example, any two adjacent curved surface areas of the front glass cover 11 are formed of glass molding in a unibody. Alternatively, any two adjacent curved surface areas of the front glass cover are integrally welded by local heating in the overlapping areas. In this case, the front surface, the four sides, and the four overlapping areas of the terminal are all wrapped by the front glass cover 11 without need to separately providing a metal frame or other connection structure for the terminal. It can simplify the terminal structure, and make the appearance of the terminal simpler and more beautiful.

For example, the flexible-bendable display screen may include a flexible organic light emitting diode (OLED) screen. For example, the material of the front glass cover 11 may include inorganic glass or organic glass.

For example, a shape of a front protective glass of the front cover glass 11 includes any of the following shapes: a plane surface, a 2.5-dimensional curved surface, and a curved surface.

For example, the front glass cover provides protection and support for the flexible-bendable display screen. The front glass cover with the first curved surface area 16, the second curved surface area 17, the third curved surface area 18 and the fourth curved surface area 19, extends to the left, right, upper and lower sides of the terminal and further to the back cover 13. The first curved surface area 16 and the second curved surface area 17 are respectively located on the left and right sides of the front surface area 15. The third curved surface area 18 and the fourth curved surface area 19 are respectively located on the upper and lower sides of the frontal area 15. The flexible-bendable display screen extends to the left, right, upper and lower sides of the terminal and further to the side surfaces of the terminal.

For example, the front glass cover 11 is an integral glass housing, and the front surface area 15, the first curved surface area 16, the second curved surface area 17, the third curved surface area 18, and the fourth curved surface area 19 are formed of glass molding in a unibody.

In the technical solution provided in the embodiment of the present disclosure, a front glass cover formed of glass molding in a unibody covers the front surface and the four sides of the terminal, and a flexible-bendable display screen is bent and covers the sides of the terminal. Thus, the front surface and the sides of the terminal are covered by the same screen. The black borders of the screen are all bent to the side surfaces, which can increase the effective display area and the screen ratio on the front surface of the screen and can eliminate the need to provide a metal middle frame for the sides of the terminal. This can simplify the terminal structure and make the terminal appearance simpler and more beautiful, improving the user experience.

Figure 6:
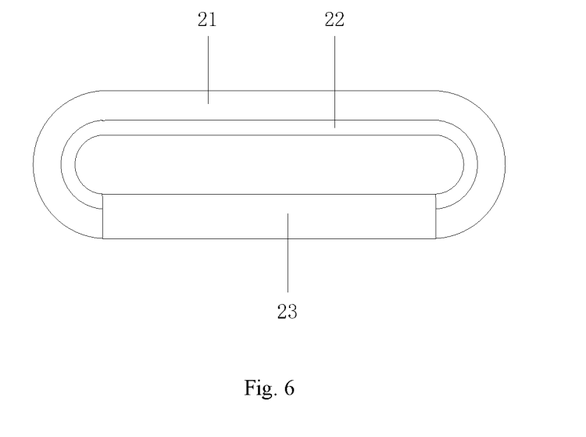
FIG. 6 is a cross sectional view of a terminal according to an example.
Figure 7:
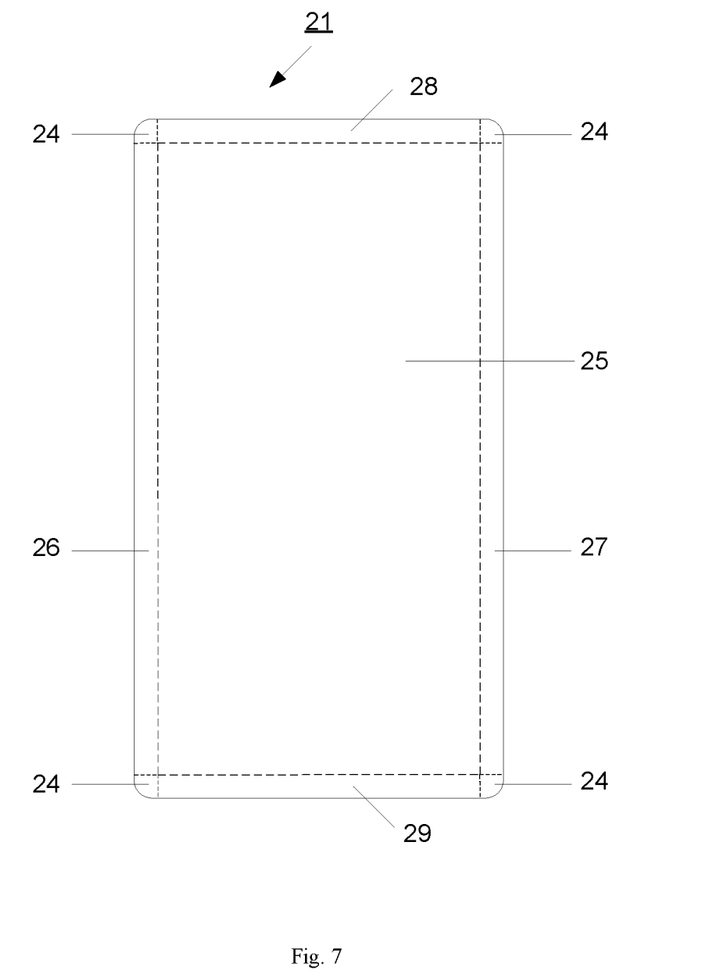
FIG. 7 is a front view of a terminal according to an example.
Figure 8:
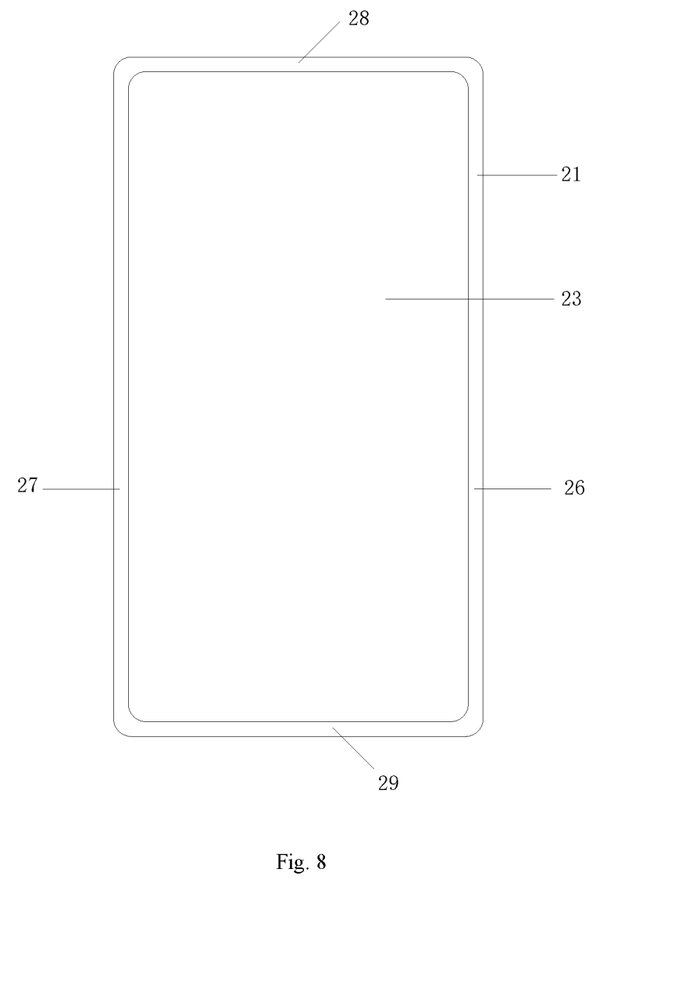
FIG. 8 is a rear view of a terminal according to an example.
Figure 9:
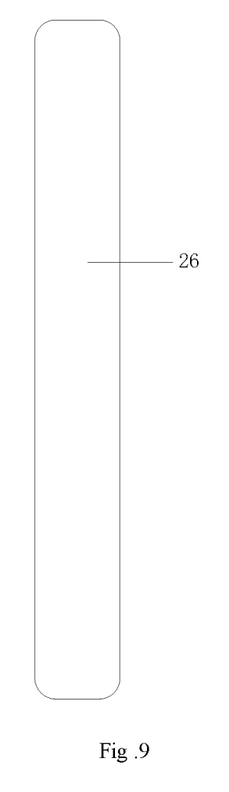
FIG. 9 is a left view of a terminal according to an example.
Figure 10:
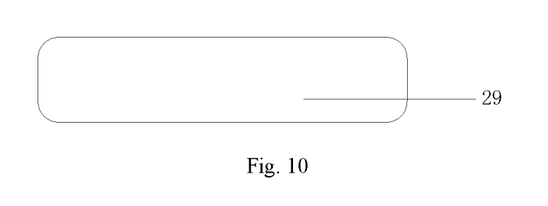
FIG. 10 is a bottom view of a terminal according to an example.

In a possible implementation, each curved surface area of the front glass cover is bent to the back surface of the terminal. The flexible-bendable display screen is bent to the back surface of the terminal. FIG. 6 is a cross sectional view of a terminal according to an example. FIG. 7 is a front view of a terminal according to an example. FIG. 8 is a rear view of a terminal according to an example. FIG. 9 is a left view of a terminal according to an example. FIG. 10 is a bottom view of a terminal according to an example. As shown in FIGS. 6 to 10, the terminal includes: a front glass cover 21, a flexible-bendable display screen 22 and a back cover 23.

The front glass cover 21 is formed of glass molding in a unibody, and includes: a front surface area 25 covering the front surface of the terminal; and a first curved surface area 26, a second curved surface area 27, a third curved surface area 28 and a fourth curved surface area 29 respectively adjacent to the front surface area 25, the first curved surface area 26, the second curved surface area 27, the third curved surface area 28 and the fourth curved surface area 29 respectively covering four sides of the terminal.

The back cover 23 is respectively connected to the first curved surface area 26, the second curved surface area 27, the third curved surface area 28 and the fourth curved surface area 29. The flexible-bendable display screen 22 is attached to an inner surface of the front glass cover 21, bent to each side surface of the terminal, bent for a second time at overlapping areas 24 of sides of the terminal and covers the four sides and the overlapping areas 24 of the terminal.

For example, in a case where each curved surface area of the front glass cover 21 is bent away from the edge of the front surface area to the back surface of the terminal, each edge of the flexible-bendable display screen may also be bent to the back surface of the terminal. Thus, the front surface, the four sides and the back edge areas of the terminal are provided with the same flexible-bendable display screen to present content display and touch control features. The black borders of the screen are all bent to the back surface of the terminal, and there are no black borders on the front surface and the side surface display areas of the screen.

Referring to FIG. 6, FIG. 9 and FIG. 10, each of the edges of the flexible-bendable display screen is also bent to the back surface of the terminal by thermally bending the four sides of the front glass cover by 180 degrees to the back cover of the terminal, such that the front surface and the sides of the terminal are covered by the same screen.

For example, the front glass cover is a glass casing in a unibody, and the solution for preparing the front glass cover in a unibody may include any one or combinations of the following: 1) processing through a computer numerical control (CNC) process; and 2) processing through a hot bending process.

In the technical solution provided in the embodiment of the present disclosure, a front glass cover formed of glass molding in a unibody covers the front surface, the sides and the back edge areas of the terminal, and a flexible-bendable display screen is bent to the back surface of the terminal such that the front surface, the sides and the back edge areas of the terminal are covered by the same screen. The black borders of the screen are all bent to the back surface of the terminal, which can increase the effective display area and the screen ratio on the front surface of the screen and can eliminate the need to provide a metal middle frame for the sides of the terminal. This can simplify the terminal structure and make the terminal appearance simpler and more beautiful, improving the user experience.

Other embodiments of the disclosure will be apparent to those skilled in the art from consideration of the specification and practice of the disclosure disclosed here. This application is intended to cover any variations, uses, or adaptations of the disclosure following the general principles thereof and including such departures from the present disclosure as come within known or customary practice in the art. It is intended that the specification and examples be considered as exemplary only, with a true scope and spirit of the disclosure being indicated by the following claims.

It will be appreciated that the present disclosure is not limited to the exact construction that has been described above and illustrated in the accompanying drawings, and that various modifications and changes may be made without departing from the scope thereof. It is intended that the scope of the disclosure only be limited by the appended claims.

What is claimed is:

1. A terminal comprising a front glass cover, a flexible-bendable display screen, and a back cover, wherein
    the front glass cover is formed of glass molding in a unibody, and comprises: a front surface area covering a front surface of the terminal; and a first curved surface area, a second curved surface area, a third curved surface area, and a fourth curved surface area disposed adjacent to the front surface area, wherein
    the first curved surface area, the second curved surface area, the third curved surface area and the fourth curved surface area respectively cover four sides of the terminal,
    two adjacent curved surface areas are formed by glass molding in the unibody,
    each curved surface area of the front glass cover is bent to a back surface of the terminal, and
    the flexible-bendable display screen is bent to the back surface of the terminal;
    the back cover includes four edge regions, each of which is respectively connected to the first curved surface area, the second curved surface area, the third curved surface area, and the fourth curved surface area; and
    the flexible-bendable display screen is attached to an inner surface of the front glass cover, bent to each side surface of the terminal, bent for a second time at overlapping areas of sides of the terminal and covers the four sides of the terminal and the overlapping areas.

2. The terminal of claim 1 wherein the flexible-bendable display screen comprises: a flexible organic light emitting diode (OLED) screen.

3. The terminal according to claim 1, wherein a shape of a front protective glass of the front glass cover comprises any one of the following shapes: a plane surface, a 2.5-dimensional curved surface, and a curved surface.

4. The terminal according to claim 1, wherein a material of the front glass cover comprises: inorganic glass.

5. The terminal according to claim 1, wherein a material of the front glass cover comprises: organic glass.

6. A terminal case, comprising:
    a front glass cover and a back cover,
    wherein the front glass cover is a glass molded in a unibody, the front glass cover comprising: a front surface area covering a front surface of the terminal; and a first curved surface area, a second curved surface area, a third curved surface area, and a fourth curved surface area disposed adjacent to the front surface area, wherein
        the first curved surface area, the second curved surface area, the third curved surface area and the fourth curved surface area respectively cover four sides of the terminal,
        two adjacent curved surface areas are formed by glass molding in the unibody, and
        each curved surface area of the front glass cover is bent to a back surface of the terminal;
    wherein the back cover comprises four edge regions, each of which is respectively connected to the first curved surface area, the second curved surface area, the third curved surface area, and the fourth curved surface area.

7. The terminal case according to claim 6, wherein a shape of a front protective glass of the front glass cover comprises: a plane surface.

8. The terminal case according to claim 6, wherein a shape of a front protective glass of the front glass cover comprises: a 2.5-dimensional curved surface.

9. The terminal case according to claim 6, wherein a shape of a front protective glass of the front glass cover comprises: a curved surface.

10. The terminal case according to claim 6, wherein a material of the front glass cover comprises: inorganic glass.

11. The terminal case according to claim 6, wherein a material of the front glass cover comprises: organic glass.

* * * * *